United States Patent
Riedlinger et al.

(10) Patent No.: US 6,873,565 B1
(45) Date of Patent: Mar. 29, 2005

(54) DUAL-PORTED READ SRAM CELL WITH IMPROVED SOFT ERROR IMMUNITY

(75) Inventors: Reid James Riedlinger, Fort Collins, CO (US); Brandon Yelton, Fort Collins, CO (US); Steven R. Affleck, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 3 days.

(21) Appl. No.: 10/684,019

(22) Filed: Oct. 10, 2003

(51) Int. Cl.[7] .............................. G11C 8/16; G11C 7/02; G11C 11/417; G11C 7/24; G11C 7/10

(52) U.S. Cl. .................. 365/230.05; 365/206; 365/154; 365/189.05

(58) Field of Search ........................ 365/230.05, 189.05, 365/189.04, 154, 206

(56) References Cited

U.S. PATENT DOCUMENTS

| | | | | |
|---|---|---|---|---|
| 5,561,638 A | * | 10/1996 | Gibson et al. | 365/230.05 |
| 6,208,565 B1 | * | 3/2001 | Riedlinger et al. | 365/189.12 |
| 6,215,694 B1 | * | 4/2001 | Li et al. | 365/156 |
| 6,504,788 B1 | * | 1/2003 | Nii et al. | 365/230.05 |
| 6,510,076 B1 | * | 1/2003 | Lapadat et al. | 365/154 |
| 6,639,866 B2 | * | 10/2003 | Slamowitz et al. | 365/230.05 |
| 6,807,081 B2 | * | 10/2004 | Nii | 365/145 |

* cited by examiner

*Primary Examiner*—Michael S. Lebentritt
*Assistant Examiner*—J. H. Hur
(74) *Attorney, Agent, or Firm*—John Pessetto

(57) ABSTRACT

In a preferred embodiment, the invention provides a circuit and method for improving the soft error rate in a dual-port read SRAM cell. A write-only transfer device is connected to a cross-coupled latch, a first wordline, and a first bitline. A first read-only transfer device is connected to a second bitline, a second wordline, and a first pull-down device. A second read-only transfer device is connected to the first bitline, the first wordline, and a second pull-down device. A clear memory transfer device is connected to the cross-coupled latch, a third bitline, and a third pull-down device. This configuration allows a reduction in the size of a dual-port SRAM cell with little or no reduction in the read access time of the cell. The reduction in size also reduces SER by reducing the cross-sectional, p/n junction area exposed to radiation.

12 Claims, 3 Drawing Sheets

DUAL-PORTED READ SRAM CELL WITH IMPROVED SOFT ERROR IMMUNITY

FIELD OF THE INVENTION

This invention relates generally to SRAM cells. More particularly, this invention relates to improving soft error immunity on dual-ported read SRAM cells.

BACKGROUND OF THE INVENTION

High-energy neutrons lose energy in materials mainly through collisions with silicon nuclei that lead to a chain of secondary reactions. These reactions deposit a dense track of electron-hole pairs as they pass through a p-n junction. Some of the deposited charge will recombine, and some will be collected at the junction contacts. When a particle strikes a sensitive region of an SRAM (Static Random Access Memory) cell, the charge that accumulates could exceed the minimum charge that is needed to "flip" the value stored in the cell, resulting in a soft error.

The smallest charge that results in a soft error is called the critical charge of the SRAM cell. The rate at which soft errors occur (SER) is typically expressed in terms of failures in time (FIT).

A common source of soft errors are alpha particles, which may be emitted by trace amounts of radioactive isotopes present in packing materials of integrated circuits. "Bump" material used in flip-chip packaging techniques has also been identified as a possible source of alpha particles.

Other sources of soft errors include high-energy cosmic rays and solar particles. High-energy cosmic rays and solar particles react with the upper atmosphere generating high-energy protons and neutrons that shower to the earth. Neutrons can be particularly troublesome as they can penetrate most man-made construction (a neutron can easily pass through five feet of concrete). This effect varies with both latitude and altitude. In London, the effect is two times worse than on the equator. In Denver, Colo. with its mile-high altitude, the effect is three times worse than a sea-level San Francisco. In a commercial airplane, the effect can be 100–800 times worse than at sea-level.

Unlike capacitor-based DRAMs (Dynamic Random Access Memory), SRAMs are constructed of cross-coupled devices, which typically have less capacitance in each cell. As SRAM cells become smaller, the capacitance in each cell typically becomes smaller. As result, the critical charge required to "flip" a SRAM cell is reduced and soft error rates may increase.

In addition, the type of capacitance in a SRAM cell may increase the SER. The capacitance in a SRAM cell, among other types, includes capacitance created by p/n junctions and capacitance created by oxides. Since electron/holes pairs are created as high-energy neutrons pass through a p/n junction, a deduction in the area of p/n junctions in a SRAM cell typically decreases the SER. Significant numbers of electron/hole pairs are not created when high-energy neutrons pass through oxides. As a result, the SER may typically be reduced by increasing the ratio of oxide capacitance to p/n junction capacitance in a SRAM cell.

There is a need in the art to reduce the SER in SRAM cells. An embodiment of this invention reduces the SER in a dual-port read SRAM cell. In addition, an embodiment of this invention deceases the read times as well as reduces the physical size of a dual-port read SRAM cell.

SUMMARY OF THE INVENTION

In a preferred embodiment, the invention provides a circuit and method for improving the soft error rate in a dual-port read SRAM cell. A write-only transfer device is connected to a cross-coupled latch, a first wordline, and a first bitline. A first read-only transfer device is connected to a second bitline, a second wordline, and a first pull-down device. A second read-only transfer device is connected to the first bitline, the first wordline, and a second pull-down device. A clear memory transfer device is connected to the cross-coupled latch, a third bitline, and a third pull-down device.

This configuration allows a reduction in the size of a dual-port SRAM cell with little or no reduction in the read access time of the cell. The reduction in size also reduces SER by reducing the cross-sectional, p/n junction area exposed to radiation.

Other aspects and advantages of the present invention will become apparent from the following detailed description, taken in conjunction with the accompanying drawings, illustrating by way of example the principles of the invention.

DETAILED DESCRIPTION OF THE PREFERRED EMBODIMENT

Figure 1:
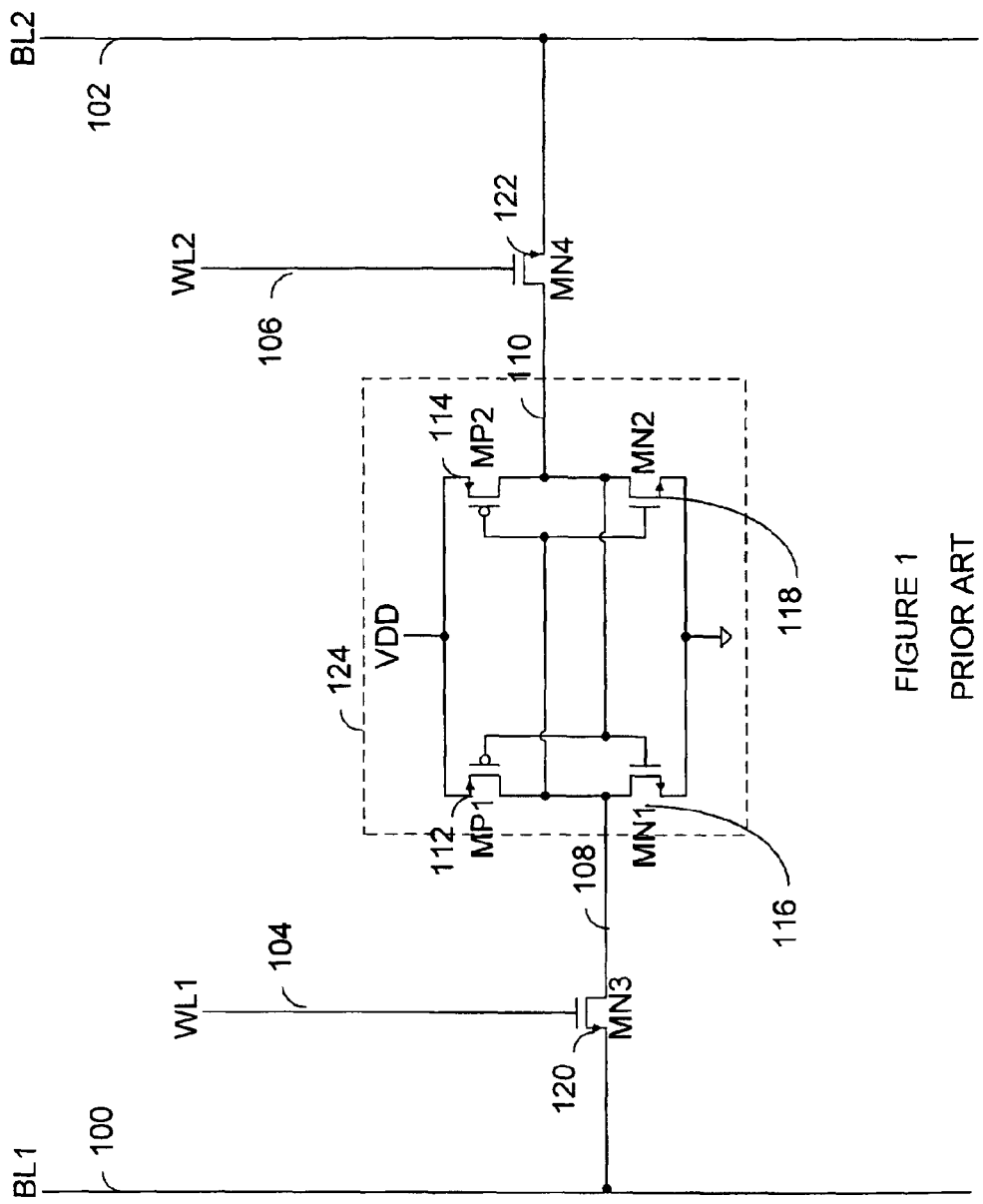
FIG. 1 is a schematic of a six transistor dual-port read SRAM cell.
Prior Art

FIG. 1 is a schematic of a six transistor dual-port read SRAM cell. Bitline, BL1, 100 is connected to the source of NFET (N-type Field Effect Transistor), MN3, 120. Bitline, BL2, 102 is connected to the source of NFET, MN4, 122. Wordline, WL1, 104 is connected to the gate of NFET, MN3, 120. Wordline, WL2, 106 is connected to the gate of NFET, MN4, 122.

The drain, 108, of NFET, MN3, 120 is connected to the drain of PFET (P-type Field Effect Transistor), MP1, 112, the drain of NFET, MN1, 116, the gate of PFET, MP2, 114, and the gate of NFET, MN2, 118.

The drain, 110, of NFET, MN4, 122 is connected to the drain of PFET (P-type Field Effect Transistor), MP2, 114, the drain of NFET, MN2, 118, the gate of PFET, MP1, 112, and the gate of NFET, MN1, 116. A cross-coupled latch, 124, in this example, includes PFET, MP1, 112, MP2, 114, MN1, 116, MN2, 118, and the connections made to them.

Data may be read from the SRAM cell shown in FIG. 1 in two ways. A first way is to bring WL1, 104 high, charging the gate of NFET, MN3, 120. Typically, the logical value on node 108 is transferred to bitline 1, BL1, 100. A second way is to bring WL2, 106 high, charging the gate of NFET, MN4, 122. Typically, the logical value on node 110 is transferred to bitline 2, BL2, 102. However, there is a possibility that the charge on bitline, BL1, 100, when WL1, 104, is high, will "flip" the value on node 108 of the cross-coupled latch, 124, to an opposite value due to charge-sharing. There is also a possibility that the charge on bitline, BL2, 102, when WL2, 106, is high, will "flip" the value on node 110 of the cross-coupled latch, 124, to an opposite value due to charge-sharing.

The sizes of NFET, MN1, 116, NFET MN2, 118, NFET MN3, 120, NFET MN4, 122, PFET MP1, 112, and PFET MP2, 114, among other reasons, are chosen to provide enough capacitance to hold enough charge to prevent the cross-coupled latch, 124, from flipping when data is read. In addition, the sizes of these six FETs are chosen to optimize the read access time of the SRAM cell. However, when these FETs are made larger, it can increase the p/n junction area exposed to radiation. As a result, the soft error rate typically increases.

Data may be written to the SRAM cell shown in FIG. 1 by first driving WL1, 104 and WL2, 106, to a high value. After driving WL1, 104 and WL2, 106 high, BL1, 100 is driven to either a high or low logical value at the same time BL2, 102, is driven to the opposite value of the value on BL1, 100. Typically, this causes the cross-coupled latch, 124, to retain the logical values imposed by BL1, 100 and BL2, 102. After the cross-coupled latch, 124, is written, WL1, 104, and WL2, 106, are discharged to a low logical value.

Figure 2:
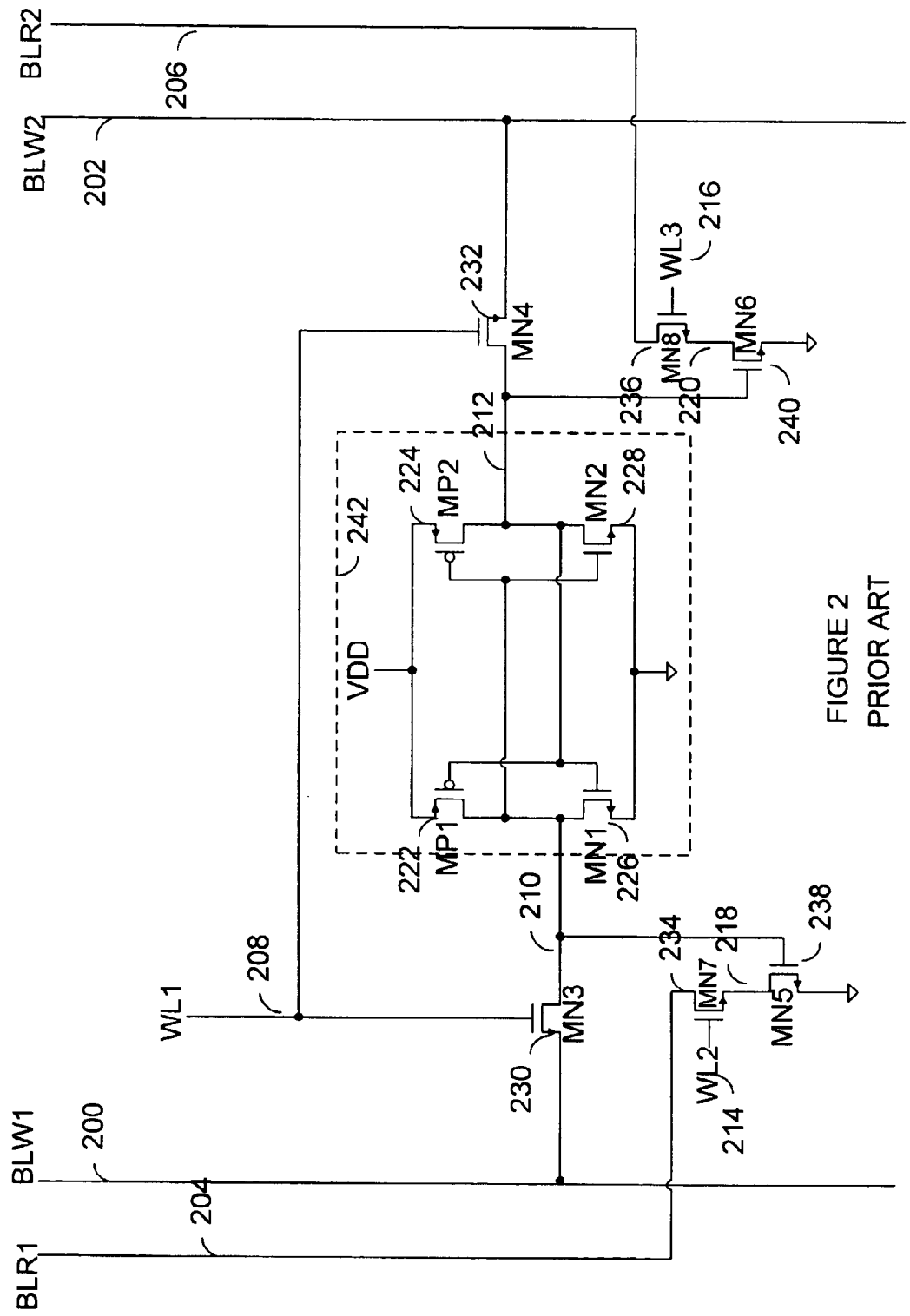
FIG. 2 is a schematic of a ten transistor dual-port read SRAM cell.
Prior Art

FIG. 2 is a schematic of a ten transistor dual-port read SRAM cell. Bitline, BLW1, 200 is connected to the source of NFET, MN3, 230. Bitline, BLW2, 202 is connected to the source of NFET, MN4, 232. Wordline, WL1, 208 is connected to the gate of NFET, MN3, 230 and to the gate of NFET, MN4, 232.

The drain, 210, of NFET, MN3, 230 is connected to the drain of PFET, MP1, 222, the drain of NFET, MN1, 226, the gate of PFET, MP2, 224, and the gate of NFET, MN2, 228.

The drain, 212, of NFET, MN4, 232 is connected to the drain of PFET, MP2, 224, the drain of NFET, MN2, 228, the gate of PFET, MP1, 222, and the gate of NFET, MN1, 226. A cross-coupled latch, 242, in this example, includes MP1, 222, MP2, 224, MN1, 226, MN2, 228, and the connections made to them.

Bitline, BLR1, 204, is connected to the drain of NFET, MN7, 234. Bitline, BLR2, 206, is connected to the drain of NFET, MN8, 236. Wordline, WL2, 214, is connected to the gate of NFET, MN7, 234. Wordline, WL3, 216, is connected to the gate of NFET, MN8, 236. The source of NFET, MN7, 234, is connected to the drain, 218, of NFET, MN5, 238. The source of NFET, MN8, 236, is connected to the drain, 220, of NFET, MN6, 240. The gate of NFET, MN5, 238, is connected to node 210. The gate of NFET, MN6, 240 is connected to node 212. The sources of NFETs, MN5, 238, and MN6, 240, are connected to ground.

Data may be read from the SRAM cell shown in FIG. 2 in two ways. After pre-charging bitlines, BLR1, 204, and BLR2, 206, high, a first way is to bring WL2, 214, high, charging the gate of NFET, MN7, 234. Charging the gate, 214, of NFET, MN7, 234, connects bitline, BLR1, 204, to the drain, 218, of NFET, MN5, 238. If node 210 of the cross-coupled latch, 242, is high, the gate, 210 of NFET, MN5, 238, is charged and connects node 218 to ground. Since, in this example, node 218, is connected to bitline, BLR1, 204, the voltage on bitline, BLR1, 204 is near ground.

However, if the value on node 210 of the cross-coupled latch, 242, is low, the gate, 210, of NFET, MN5, 238 is low and node 218 is not connected to ground. In this case, the bitline, BLR1, 204, remains high. Ideally, the value of the bitline, BLR1, 204, after reading, is the opposite sense of the value stored on node 210 of the cross-coupled latch, 242.

Data may also be read from the SRAM cell shown in FIG. 2 in a second way. After pre-charging bitlines, BLR1, 204, and BLR2, 206, high, a second way is to bring WL3, 216, high, charging the gate of NFET, MN8, 236. Charging the gate, 216, of NFET, MN8, 236, connects bitline, BLR2, 206, to the drain, 220, of NFET, MN6, 240. If node 212 of the cross-coupled latch, 242, is high, the gate, 212 of NFET, MN6, 240, is charged and connects node 220 to ground. Since, in this example, node 220, is connected to bitline, BLR2, 206, the voltage on bitline, BLR2, 206 is near ground.

However, if the value on node 212 of the cross-coupled latch, 242, is low, the gate, 212, of NFET, MN6, 240 is low and node 220 is not connected to ground. In this case, the bitline, BLR2, 206, remains high. Ideally, the value of the bitline, BLR2, 206, after reading, is the opposite sense of the value stored on node 212 of the cross-coupled latch, 242.

A benefit of the ten transistor dual-port read SRAM cell shown in FIG. 2 is that charge-sharing between bitline, BLR1, 204, and node 210 of the cross-coupled latch, 242, is greatly reduced if not eliminated. Charge-sharing between bitline, BLR2, 206, and node 212 of the cross-coupled latch, 242, is greatly reduced if not eliminated. Since charge-sharing is greatly reduced in this example, the sizes of FETs, MN1, 226, MN2, 228, MN3, 230, MN4, 232, MP1, 222, and MP2, 224 may be reduced. Because the sizes of FETs, MN1, 226, MN2, 228, MN3, 230, MN4, 232, MP1, 222, and MP2, 224 may be reduced, the p/n junction area associated with these FETs is also reduced. Since the p/n junction area is reduced, the soft error rate is usually reduced as well.

Data may be written to the SRAM cell shown in FIG. 2 by first driving WL1, 208 to a high value. After driving WL1, 208 high, BLW1, 200 is driven to either a high or low logical value at the same time BLW2, 202, is driven to the opposite value of the value on BLW1, 200. Typically, this causes the cross-coupled latch, 242, to retain the logical values imposed by BLW1, 200 and BLW2, 102. After the cross-coupled latch, 242, is written, WL1, 208, is discharged to a low logical value.

Even though the sizes of FETs, MN1, 226, MN2, 228, MN3, 230, MN4, 232, MP1, 222, and MP2, 224 may be reduced in this example, the overall size of the SRAM cell may be limited by the control lines to the SRAM cell, BLR1, 204, BLR2, 206, BLW1, 200, BLW2, 202, WL1, 208, WL2, 214, and WL3, 216. The width of these lines and the separation between them may limit the size of the SRAM cell in this example. In this example, there are seven control lines, BLR1, 204, BLR2, 206, BLW1, 200, BLW2, 202, WL1, 208, WL2, 214, and WL3, 216.

Figure 3:
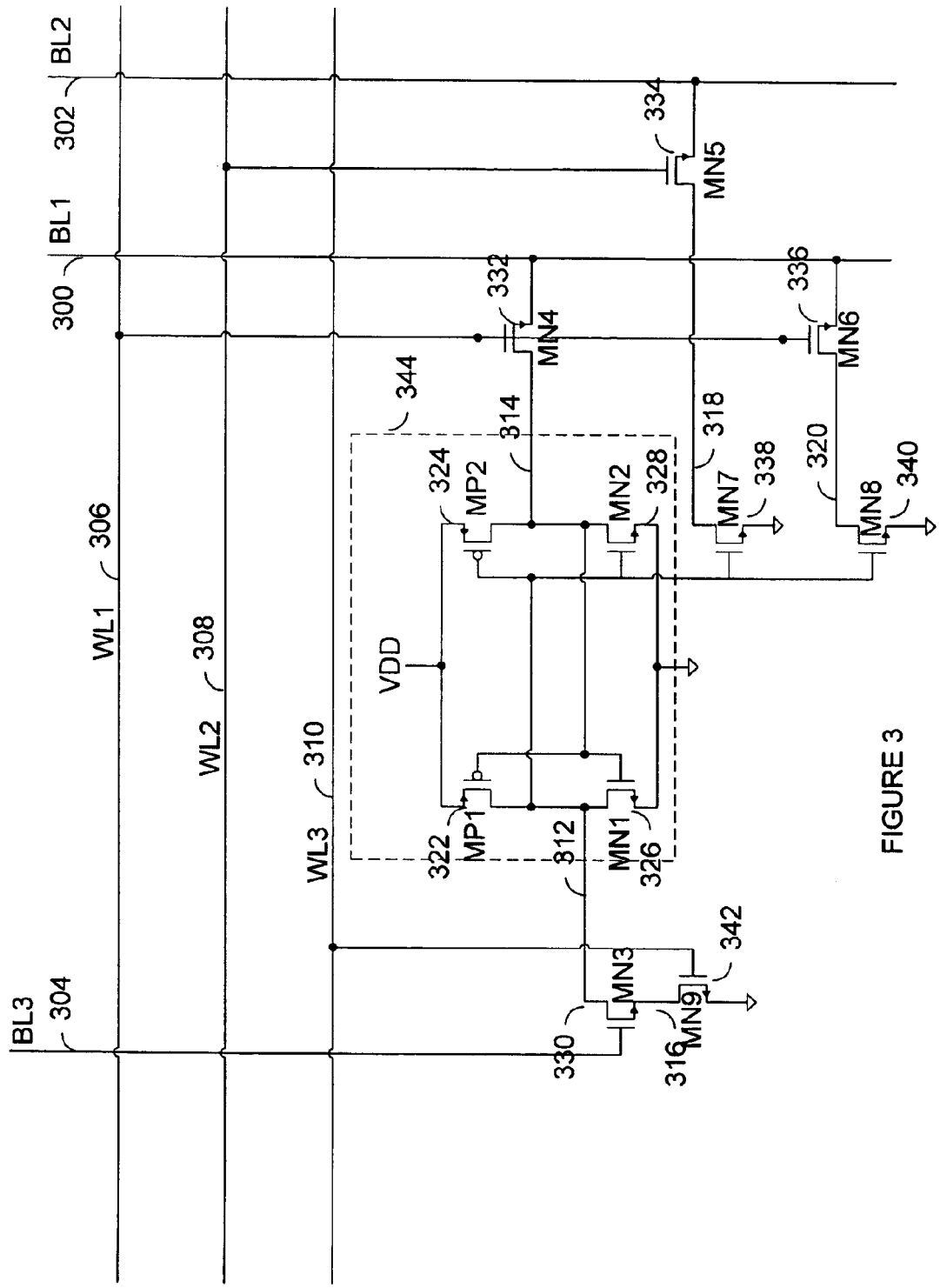
FIG. 3 is a schematic of an eleven transistor dual-port read SRAM cell.

FIG. 3 is a schematic of an eleven transistor dual-port read SRAM cell. Bitline, BL1, 300 is connected to the source of NFET, MN4, 332 and the source of NFET, MN6, 336. Bitline, BL2, 302 is connected to the source of NFET, MN5, 232. Bitline, BL3, 304 is connected to the gate of NFET, MN3, 330. Wordline, WL1, 306 is connected to the gate of NFET, MN4, 332, and to the gate of NFET, MN6, 336. Wordline, WL2, 308 is connected to the gate of NFET, MN5, 334. Wordline, WL3, 310 is connected to the gate of NFET, MN9, 342.

The drain, 312, of NFET, MN3, 330 is connected to the drain of PFET, MP1, 322, the drain of NFET, MN1, 326, the gate of PFET, MP2, 324, the gate of NFET, MN2, 328, the gate of MN7, 338, and the gate of MN8, 340.

The drain, 314, of NFET, MN4, 332 is connected to the drain of PFET, MP2, 324, the drain of NFET, MN2, 328, the gate of PFET, MP1, 322, and the gate of NFET, MN1, 326. A cross-coupled latch, 344, in this example, includes MP1, 322, MP2, 324, MN1, 326, MN2, 328, and the connections made to them.

The source, 316, of NFET, MN3, 330, is connected to the drain, 316, of NFET, MN9, 342. The source of NFET, MN9, 342 is connected to ground. The drain, 318, of NFET, MN5, 334, is connected to the drain, 318, of NFET, MN7, 338. The source of NFET, MN7, 338 is connected to ground. The drain, 320, of NFET, MN6, 336, is connected to the drain, 320, of NFET, MN8, 340. The source of NFET, MN7, 340 is connected to ground.

Data may be read from the SRAM cell shown in FIG. 3 in two ways. After pre-charging bitlines, BL1, 300, and BL2, 302, high, a first way to read data from the SRAM cell shown in FIG. 3 is to bring WL1, 306, high, charging the gate of NFET, MN6, 336. Charging the gate, 306, of NFET, MN6, 336, connects bitline, BL1, 300, to the drain, 320, of NFET, MN8, 340. If node 312 of the cross-coupled latch, 344, is high, the gate, 312 of NFET, MN8, 340, is charged and connects node 320 to ground. Since, in this example, node 320, is connected to bitline, BL1, 300, the voltage on bitline, BL1, 300 is near ground.

In addition, if node 312 of the cross-coupled latch, 344, is high, the node 314, of the cross-coupled latch, 344, is low. Since the gate, 300, of NFET, MN4, 332, in this example, is high, BL1, 300, is connected to node 314. Since node 314 of the cross-coupled latch, 344, is low, node 314 also discharges BL1, 300, from a high to a low value.

However, if the value on node 312 of the cross-coupled latch, 344, is low, the gate, 312, of NFET, MN8, 340 is low and node 320 is not connected to ground. In this case, the bitline, BL1, 300, remains high. Ideally, the value of the bitline, BL1, 300, after reading, is the opposite sense of the value stored on node 312 of the cross-coupled latch, 344.

Data may also be read from the SRAM cell shown in FIG. 3 in a second way. After pre-charging bitlines, BL1, 300, and BL2, 302, high, a second way is to bring WL2; 308, high, charging the gate of NFET, MN5, 334. Charging the gate, 308, of NFET, MN5, 334, connects bitline, BL2, 302, to the drain, 318, of NFET, MN7, 338. If node 312 of the cross-coupled latch, 344, is high, the gate, 312 of NFET, MN7, 338, is charged and connects node 318 to ground. Since, in this example, node 318, is connected to bitline, BL2, 302, the voltage on bitline, BL2, 302 is near ground.

However, if the value on node 312 of the cross-coupled latch, 344, is low, the gate, 312, of NFET, MN7, 338 is low and node 318 is not connected to ground. In this case, the bitline, BL2, 302, is held high. Ideally, the value of the bitline, BL2, 302, after reading, is the opposite sense of the value stored on node 312 of the cross-coupled latch, 344.

A benefit of the eleven transistor dual-port read SRAM cell shown in FIG. 3 is that charge-sharing between bitline, BL1, 300, and node 312 of the cross-coupled latch, 344, is greatly reduced. Some charge-sharing exists between bitline, BL1, 300 and node 314 of the cross-coupled latch, 344. However since NFET, MN4, 332, may be made small, the probability of charge-sharing flipping the state of the cross-coupled latch, 344, is reduced.

Charge-sharing between bitline, BL2, 302, and node 312 of the cross-coupled latch, 344, is greatly reduced if not eliminated. Since charge-sharing is greatly reduced in this example, the size s of FETs, MN1, 326, MN2, 328, MN3, 330, MN4, 332, MP1, 322, and MP2, 324 may be reduced. Because the sizes of FETs, MN1, 326, MN2, 328, MN3, 330, MN4, 332, MP1, 322, and MP2, 324 may be reduced, the p/n junction area associated with these FETs is also reduced. Since the p/n junction area is reduced, the soft error rate is usually reduced as well.

Even though the sizes of FETs, MN1, 326, MN2, 328, MN3, 330, MN4, 332, MP1, 322, and MP2, 324 may be reduced in this example, the overall size of the SRAM cell may be limited by the control lines to the SRAM cell, BL1, 300, BL2, 302, BL3, 304, WL1, 306, WL2, 308, and WL3, 310. The width of these lines and the separation between them may limit the size of the SRAM cell in this example. In this example, there are six control lines, BL1, 300, BL2, 302, BL3, 304, WL1, 306, WL2, 308, and WL3, 310. The number of control lines, six, shown is FIG. 3 is one less than the number of control lines, seven, shown in FIG. 2. As a result, the SRAM cell in FIG. 3 may be designed smaller than the SRAM cell in FIG. 2.

A logical one may be written to the SRAM cell shown in FIG. 3 by first driving WL1, 306 to a high value. After driving WL1, 306 high, BL1, 300 is driven to a low logical value. Typically, this causes the cross-coupled latch, 344, to retain a logical one. Next, WL3, 310, is driven high and WL1, 306, is discharged to a logical zero. A logical one is written by leaving BL3, 304, low. In this case, NFET, MN3, 330, remains off and a logical one is maintained on node 312.

A logical zero may be written to the SRAM cell shown in FIG. 3 by first driving WL1, 306 to a high value. After driving WL1, 306 high, BL1, 300 is driven to a low logical value. Typically, this causes the cross-coupled latch, 344, to retain a logical one. Next, WL3, 310, is driven high and WL1, 306, is discharged to a logical zero. A logical zero is written by driving BL3, 304, high. In this case, NFET, MN3, 330, is turned on. Because NFET, MN3, 330 and NFET, MN9, 342, are on, node 312 is connected to ground or near ground.

In addition to improving SER and providing a smaller SRAM cell, the dual-ported read SRAM cell shown in FIG. 3, allows an array of dual-ported read SRAM cells to be globally set or cleared.

An array of dual-ported read SRAM cells may be globally set (storing a high value on node 312) by first pre-charging BL1, 300 to a high value. After WL1, 306, is driven high, BL1, 300, is driven low. By driving BL1, 300, low and driving WL1, 306 high, a low value is driven onto node 314 of the cross-coupled latch, 344. As result, node 312, of the cross-coupled latch, 344, is driven high.

An array of dual-ported read SRAM cells may be globally cleared (storing a low value on node 312) by driving BL3, 304, high, when WL3, 310 drives the gate of NFET, MN9, 342, high. Since the gate, 304 of NFET, MN3, 330, is high, NFET, MN3 is on and connects node 312, of cross-coupled latch, 344, to node 316. Because WL3, 310, is high, the gate, 310, of NFET, MN9, 342, is on. Since NFET, MN9, 342, is on, node 316 and node 312 are connected to a voltage close to ground. When node 312, of cross-coupled latch, 344, is low, node 314, of the cross-coupled latch, is high.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A dual-port read SRAM cell for reducing soft errors comprising:
   a) a cross-coupled latch, the cross-coupled latch having an input/output, and an input;
   b) a first transfer device, the first transfer device having an input, a control input, and a output;
   c) a second transfer device, the second transfer device having an input, a control input, and a output;
   d) a third transfer device, the third transfer device having an input, a control input, and a output;
   e) a fourth transfer device, the fourth transfer device having an input, a control input, and a output;
   f) a first pull-down device, the first pull-down device having an input, a control input, and a output;
   g) a second pull-down device, the second pull-down device having an input, a control input, and a output;
   h) a third pull-down device, the third pull-down device having an input, a control input, and a output;
   i) wherein the input/output of the cross-coupled latch is connected to the input of the fourth transfer device, the control input of the fourth transfer device is connected to a third bitline, and the output of the fourth transfer device is connect to the output of the third pull-down device;
   j) wherein the control input of the third pull-down device is connected to a third wordline, and the input of the third pull-down device is connected to ground;
   k) wherein the input of the cross-coupled latch is connected to the output of the first transfer device, the control input of the first transfer device is connected to a first wordline, and the input of the first transfer device is connected to a first bitline;
   l) wherein the input/output of the cross-coupled latch is connected to the control inputs of the first and second pull-down devices;
   m) wherein the output of the first pull-down device is connected to the input of the second transfer device, the control input of the second transfer device is connected to a second wordline, and the output of the second transfer device is connected to a second bitline;
   n) wherein the output of the second pull-down device is connected to the input of the third transfer device, the control input of the third transfer device is connected to the first wordline, and the output of the third transfer device is connected to the first bitline;
   o) wherein the inputs of the first and second pull-down devices connected to ground.

2. The dual-port read SRAM cell as in claim 1 wherein the cross-coupled latch comprises:
   a) a first PFET, the first PFET having a gate, a drain and a source;
   b) a second PFET, the second PFET having a gate, a drain and a source;
   c) a first NFET, the first NFET having a gate, a drain and a source;
   d) a second NFET, the second NFET having a gate, a drain and a source;
   e) wherein the sources of the first and second PFETs are connected to VDD;
   f) wherein the sources of the first and second NFETs are connected to GND;
   g) wherein the drain of the first PFET, the drain of the first NFET, the gate of the second PFET and the gate of the second NFET are connected to the input/output of the cross-coupled latch;
   h) wherein the drain of the second PFET, the drain of the second NFET, the gate of the first PFET and the gate of the first NFET are connected to the input of the cross-coupled latch.

3. The dual-port read SRAM cell as in claim 2 wherein:
   a) the first transfer device comprises a third NFET such that the drain of the third NFET is connected to the output of the first transfer device, the gate of the third NFET is connected to the control input of the first transfer device, and the source of the third NFET is connected to the input of the first transfer device;
   b) the second transfer device comprises a fourth NFET such that the source of the fourth NFET is connected to the input of the second transfer device, the gate of the fourth NFET is connected to the control input of the second transfer device, and the drain of the fourth NFET is connected to the output of the second transfer device;
   c) the third transfer device comprises a fifth NFET such that the source of the fifth NFET is connected to the input of the third transfer device, the gate of the fifth NFET is connected to the control input of the third transfer device, and the drain of the fifth NFET is connected to the output of the third transfer device;
   d) the fourth transfer device comprises a sixth NFET such that the drain of the sixth NFET is connected to the input of the fourth transfer device, the gate of the sixth NFET is connected to the control input of the fourth transfer device, and the source of the sixth NFET is connected to the output of the fourth transfer device.

4. The dual-port read SRAM cell as in claim 3 wherein:
   a) the first pull-down device comprises a seventh NFET such that the drain of the seventh NFET is connected to the output of the first pull-down device, the gate of the seventh NFET is connected to the control input of the first pull-down device, and the source of the seventh NFET is connected to the input of the first pull-down device;
   b) the second pull-down device comprises an eighth NFET such that the drain of the eighth NFET is connected to the output of the second pull-down device, the gate of the eighth NFET is connected to the control input of the second pull-down device, and the source of the eighth NFET is connected to the input of the second pull-down device;
   c) the third pull-down device comprises an ninth NFET such that the drain of the ninth NFET is connected to the output of the third pull-down device, the gate of the ninth NFET is connected to the control input of the third pull-down device, and the source of the ninth NFET is connected to the input of the third pull-down device.

5. The dual-port read SRAM cell as in claim 1 wherein the input of the first transfer device is a write-only port.

6. The dual-port read SRAM cell as in claim 1 wherein the output of the second transfer device and the output of the third transfer device are read-only ports.

7. The dual-port read SRAM cell as in claim 6 wherein the input of the first transfer device is a write-only port.

8. A method for manufacturing a dual-port read SRAM cell with improved soft error rate comprising:
   a) fabricating a cross-coupled latch, the cross-coup led latch having an input/output, and an input;
   b) fabricating a first transfer device, the first transfer device having an input, a control input, and a output;

c) fabricating a second transfer device, the second transfer device having an input, a control input, and a output;

d) fabricating a third transfer device, the third transfer device having an input, a control input, and a output;

e) fabricating a fourth transfer device, the fourth transfer device having an input, a control input, and a output;

f) fabricating a first pull-down device, the first pull-down device having an input, a control input, and a output;

g) fabricating a second pull-down device, the second pull-down device having an input, a control input, and a output;

h) fabricating a third pull-down device, the third pull-down device having an input, a control input, and a output;

i) wherein the input/output of the cross-coupled latch is connected to the input of the fourth transfer device, the control input of the fourth transfer device is connected to a third bitline, and the output of the fourth transfer device is connect to the output of the third pull-down device;

j) wherein the control input of the third pull-down device is connected to a third wordline, and the input of the third pull-down device is connected to ground;

k) wherein the input of the cross-coupled latch is connected to the output of the first transfer device, the control input of the first transfer device is connected to a first wordline, and the input of the first transfer device is connected to a first bitline;

l) wherein the input/output of the cross-coupled latch is connected to the control inputs of the first and second pull-down devices;

m) wherein the output of the first pull-down device is connected to the input of the second transfer device, the control input of the second transfer device is connected to a second wordline, and the output of the second transfer device is connected to a second bitline;

n) wherein the output of the second pull-down device is connected to the input of the third transfer device, the control input of the third transfer device is connected to the first wordline, and the output of the third transfer device is connected to the first bitline;

o) wherein the inputs of the first and second pull-down devices connected to ground.

9. The method as in claim 8 wherein the cross-coupled latch comprises:

a) a first PFET, the first PFET having a gate, a drain and a source;

b) a second PFET, the second PFET having a gate, a drain and a source;

c) a first NFET, the first NFET having a gate, a drain and a source;

d) a second NFET, the second NFET having a gate, a drain and a source;

e) wherein the sources of the first and second PFETs are connected to VDD;

f) wherein the sources of the first and second NFETs are connected to GND;

g) wherein the drain of the first PFET, the drain of the first NFET, the gate of the second PFET and the gate of the second NFET are connected to the input/output of the cross-coupled latch;

h) wherein the drain of the second PFET, the drain of the second NFET, the gate of the first PFET and the gate of the first NFET are connected to the input of the cross-coupled latch.

10. The method as in claim 9 wherein:

a) the first transfer device comprises a third NFET such that the drain of the third NFET is connected to the output of the first transfer device, the gate of the third NFET is connected to the control input of the first transfer device, and the source of the third NFET is connected to the input of the first transfer device;

b) the second transfer device comprises a fourth NFET such that the source of the fourth NFET is connected to the input of the second transfer device, the gate of the fourth NFET is connected to the control input of the second transfer device, and the drain of the fourth NFET is connected to the output of the second transfer device;

c) the third transfer device comprises a fifth NFET such that the source of the fifth NFET is connected to the input of the third transfer device, the gate of the fifth NFET is connected to the control input of the third transfer device, and the drain of the fifth NFET is connected to the output of the third transfer device;

d) the fourth transfer device comprises a sixth NFET such that the drain of the sixth NFET is connected to the input of the fourth transfer device, the gate of the sixth NFET is connected to the control input of the fourth transfer device, and the source of the sixth NFET is connected to the output of the fourth transfer device.

11. The method as in claim 10 wherein:

a) the first pull-down device comprises a seventh NFET such that the drain of the seventh NFET is connected to the output of the first pull-down device, the gate of the seventh NFET is connected to the control input of the first pull-down device, and the source of the seventh NFET is connected to the input of the first pull-down device;

b) the second pull-down device comprises an eighth NFET such that the drain of the eighth NFET is connected to the output of the second pull-down device, the gate of the eighth NFET is connected to the control input of the second pull-down device, and the source of the eighth NFET is connected to the input of the second pull-down device;

c) the third pull-down device comprises an ninth NFET such that the drain of the ninth NFET is connected to the output of the third pull-down device, the gate of the ninth NFET is connected to the control input of the third pull-down device, and the source of the ninth NFET is connected to the input of the third pull-down device.

12. A dual-port read SRAM cell for reducing soft errors comprising:

a) a means for storing charge, the means for storing charge having an input/output, and an input;

b) a first means for transferring charge, the first means for transferring charge having an input, a control input, and a output;

c) a second means for transferring charge, the second means for transferring charge having an input, a control input, and a output;

d) a third means for transferring charge, the third means for transferring charge having an input, a control input, and a output;

e) a fourth means for transferring charge, the fourth means for transferring charge having an input, a control input, and a output;

f) a first means for connecting a node to ground, the first means for connecting a node to ground having an input, a control input, and a output;

g) a second means for connecting a node to ground, the means for connecting a node to ground having an input, a control input, and a output;

h) a third means for connecting a node to ground, the third means for connecting a node to ground having an input, a control input, and a output;

i) wherein the input/output of the means for storing charge is connected to the input of the fourth means for transferring charge, the control input of the fourth means for transferring charge is connected to a third bitline, and the output of the fourth means for transferring charge is connect to the output of the third means for connecting a node to ground;

j) wherein the control input of the third means for connecting a node to ground is connected to a third wordline, and the input of the third means for connecting a node to ground is connected to ground;

k) wherein the input of the means for storing charge is connected to the output of the first means for transferring charge, the control input of the first means for transferring charge is connected to a first wordline, and the input of the first means for transferring charge is connected to a first bitline;

l) wherein the input/output of the means for storing charge is connected to the control inputs of the first and second means for connecting a node to ground;

m) wherein the output of the first means for connecting a node to ground is connected to the input of the second means for transferring charge, the control input of the second means for transferring charge is connected to a second wordline, and the output of the second means for transferring charge is connected to a second bitline;

n) wherein the output of the second means for connecting a node to ground is connected to the input of the third means for transferring charge, the control input of the third means for transferring charge is connected to the first wordline, and the output of the third means for transferring charge is connected to the first bitline;

o) wherein the inputs of the first and second pull-down devices node to ground are connected to ground.

* * * * *